US 9,628,819 B2

(12) United States Patent
Boisson et al.

(10) Patent No.: US 9,628,819 B2
(45) Date of Patent: Apr. 18, 2017

(54) METHOD FOR CODING A VIDEO IMAGE TAKING INTO ACCOUNT THE PART RELATING TO A COMPONENT OF A MOVEMENT VECTOR

(75) Inventors: Guillaume Boisson, Rennes (FR); Dominique Thoreau, Cesson Sevigne (FR); Edouard Francois, Bourg des Comptes (FR)

(73) Assignee: THOMSON LICENSING DTV, Issey les Moulineaux (FR)

( * ) Notice: Subject to any disclaimer, the term of this patent is extended or adjusted under 35 U.S.C. 154(b) by 3057 days.

(21) Appl. No.: 10/546,715

(22) PCT Filed: Feb. 26, 2004

(86) PCT No.: PCT/FR2004/050084
§ 371 (c)(1),
(2), (4) Date: Mar. 29, 2007

(87) PCT Pub. No.: WO2004/082293
PCT Pub. Date: Sep. 23, 2004

(65) Prior Publication Data
US 2007/0189389 A1 Aug. 16, 2007

(30) Foreign Application Priority Data
Mar. 6, 2003 (FR) .................................. 03 02840

(51) Int. Cl.
*H04N 7/12* (2006.01)
*H04N 19/615* (2014.01)
(Continued)

(52) U.S. Cl.
CPC ......... *H04N 19/615* (2014.11); *H04N 19/105* (2014.11); *H04N 19/517* (2014.11);
(Continued)

(58) Field of Classification Search
CPC .... H03M 7/40; H03M 7/4006; H04N 19/105; H04N 19/13; H04N 19/517; H04N 19/61; H04N 19/615; H04N 19/63
(Continued)

(56) References Cited
U.S. PATENT DOCUMENTS 5,748,786 A    5/1998 Zandi et al.
5,886,651 A    3/1999 Chui et al.
(Continued)

FOREIGN PATENT DOCUMENTS

AU    760244    5/2003
AU    770051    2/2004
(Continued)

OTHER PUBLICATIONS

Vincent Bottreau, "A Fully Scalable 3D Subband Video Codec", 2001 IEEE p. 1017-1020.*
(Continued)

*Primary Examiner* — Jessica M Prince
(74) *Attorney, Agent, or Firm* — Tutunjian & Bitetto, P.C.

(57) ABSTRACT

The following steps are carried out in the inventive method: estimation of movement between a current moment corresponding to the current image and a reference moment corresponding to a reference image in order to provide a movement vector, an entropic coding for a high spatial frequency signal relating in the current image, taking into account a temporal context based on the estimation of a movement, one of the parameters used to calculate the temporal context being the parity of a component of the movement vector. Applications are related to video compression with temporal prediction.

26 Claims, 4 Drawing Sheets

(51) Int. Cl.
| | |
|---|---|
| H04N 19/105 | (2014.01) |
| H04N 19/63 | (2014.01) |
| H04N 19/61 | (2014.01) |
| H04N 19/517 | (2014.01) |
| H03M 7/40 | (2006.01) |
| H04N 19/13 | (2014.01) |

(52) U.S. Cl.
CPC ............ *H04N 19/61* (2014.11); *H04N 19/63* (2014.11); *H03M 7/40* (2013.01); *H03M 7/4006* (2013.01); *H04N 19/13* (2014.11)

(58) Field of Classification Search
USPC .................. 375/240.16, 240.29; 382/240
See application file for complete search history.

(56) References Cited

U.S. PATENT DOCUMENTS

| | | | |
|---|---|---|---|
| 5,959,560 | A | 9/1999 | Said et al. |
| 6,049,362 | A * | 4/2000 | Butter ................ H04N 19/197 348/699 |
| 6,195,465 | B1 | 2/2001 | Zandi et al. |
| 7,027,512 | B2 * | 4/2006 | Jeon ................... H04N 19/619 375/240 |
| 7,672,520 | B2 * | 3/2010 | Lopez .................. H04N 19/70 348/472 |
| 2002/0031182 | A1 | 3/2002 | Kishi |
| 2002/0131505 | A1 | 9/2002 | Vidunas |
| 2002/0141499 | A1 | 10/2002 | Goertzen |
| 2002/0172427 | A1 | 11/2002 | Malvar |
| 2003/0026341 | A1 * | 2/2003 | Li ........................ H04N 19/63 375/240.19 |
| 2003/0198394 | A1 | 10/2003 | Fukuhara et al. |
| 2004/0114689 | A1 * | 6/2004 | Zhang .................. H04N 19/70 375/240.16 |
| 2004/0131268 | A1 | 7/2004 | Sekiguchi et al. |

FOREIGN PATENT DOCUMENTS

| | | |
|---|---|---|
| EP | 0797348 | 9/1997 |
| EP | 813168 | 12/1997 |
| EP | 1037468 | 9/2000 |
| JP | 9027912 | 1/1997 |
| JP | 9121359 | 5/1997 |
| JP | 2000197052 | 7/2000 |
| JP | 2002034043 | 1/2002 |
| JP | 2002223446 | 8/2002 |
| JP | 2005516494 | 6/2005 |
| WO | WO9840842 | 9/1998 |
| WO | WO0106794 | 1/2001 |
| WO | WO0237859 | 5/2002 |
| WO | WO03003745 | 1/2003 |
| WO | WO03063497 | 7/2003 |

OTHER PUBLICATIONS

D. Marpe et al., Efficient Entropy Coding for Video Compression Using Context-Based Adaptive Binary Arithmetic Codingm ITG Facherichtem VDE Verlatm Berlin DEm vol. 170, Jan. 20, 2002 pp. 297-300.*

D. Marpe et al., "Efficient Entropy Coding for Video Compression by Using Context-Based Adaptive Binary Arithmetic Coding", ITG Fachberichte, VDE Verlag, Berlin, DE, vol. 170, Jan. 20, 2002, pp. 297-300.

D. Marpe et al.. "A Two-Layered Wavelet-Based Algorithm for Efficient Lossless and Lossy Image Compression" IEEE Transactions on Circuits and Systems for Video Technology, IEEE Inc., New York, US, vol. 10, No. 7, Oct. 2000, pp. 1094-1102.

M.A. Al-Mohimeed et al.: "Motion Estimation and Compensation Based on Almost Shift-Invariant Wavelet Transform for Image Sequence Coding", International Journal of Imaging Systems and Technology, Wiley and Sons, New York US, vol. 9, No. 4, 1998, pp. 214-229.

G.G. Langdon et al.: "Compression of Black-White Images With Arithmetic Coding", IEEE Transactions on Communications System, New York, NY US, vol. 29, No. 6, 1981, pp. 858-867.

Search Report dated Aug. 5, 2004.

International Standard ISO/IEC 14496-2, "Information Technology—Generic Coding of Audio-Visual Objects, Part 2: Visual", ISO/IEC JTC1/SC29/WG11 N2502, Atlantic City, Oct. 1998, pp. 1-343.

Wiegand et al., "Report of Ad-Hoc Group Activity", Joint Video Team (JTV) of ISO/IEC MPEG and ITU-T VCEG, 4th Meeting: Klagenfurt, Austria, Jul. 22, 2002, pp. 1-146.

Alagoda et al., "A Massively Parallel Per-Pixel Based Zerotree Processing Architecture for Real-Time Video Compression", SPIE Design, Characterization, and Packaging for MEMS and Microelectronics II, vol. 4593, 2001, pp. 198-208.

Felts et al., "Efficient Context Modeling in Scalable 3D Wavelet-Based Video Compression", 2000 International Conference on Image Processing, Vancouver, British Columbia, Canada, Sep. 10, 2000, vol. 1, pp. 1004-1007.

Han et al., "Efficient Encoding of Dense Motion Fields Formotion-Compensated Video Compression", 1999 International Conference on Image Processing, Kobe, Japan, Oct. 24, 1999, vol. 1, pp. 84-88.

Karlekar et al., "SPIHT Video Coder", 1998 IEEE Region 10 International Conference on Global Connectivity in Energy, Computer, Communication and Control, New Delhi, India, Dec. 17, 1998, vol. 1, pp. 45-48.

Marpe et al. "Design of a Highly Efficient Wavelet-based Video Coding Scheme", SPIE_Visual Communications and Image Processing 2002, vol. 4671, 2002, pp. 1133-11411.

Brady et al., "Shape Compression of Moving Objects Using Context-based Arithmetic Encoding", Signal Processing: Image Communication, vol. 15, 2000, pp. 601-617.

Aiazzi et al., "Context modeling for near lossless image coding", IEEE Signal Processing Letters, vol. 9, No. 3, Mar. 2002, pp. 77-80.

Boulgouris et al., "Wavelet Image Coding Using Intercontext Arithmetic Adaptation", SPIE—Image and Video Communications and Processing 2000, vol. 3974, 2000, pp. 635-642.

Carotti et al., "Backward-Adaptive Lossless Compression of Video Sequences", 2002 IEEE International Conference on Acoustics, Speech, and Signal Processing, Orlando, Florida, USA, May 13, 2002, pp. 3417-3420.

Deng, G., "Transform domain LMS-based adaptive prediction for lossless image cdoing", Signal Processing: Image Communication, vol. 17, 2002, pp. 219-229.

Efstratiadis et al., "Image Compression Using Subband/Wavelet Transform and Adaptive Multiple Distribution Entropy Coding", SPIE—Visual Communications and Image Processing, vol. 1818, 1992, pp. 753-764.

Blasiak et al., "Efficient Wavelet Coding of Motion Compensated Prediction Residuals", 1998 International Conference of Image Processing, Chicago, Illinois, USA, Oct. 4, 1998, vol. 2, pp. 287-291.

Telecommunication Standard ITU-T H.264, Series H: Audiovisual and Multimedia Systems Infrastructure of Audiovisual Services—Coding of Moving Video, Advanced video coding for generic audiovisual services, May 2003, pp. 1-282.

Lee et al., "Binary Shape Coding Using Baseline-Based Method", IEEE Transactions on Circuits and Systems for Video Technology, vol. 9, No. 1, Feb. 1999, pp. 44-58.

Marpe et al., "Video Compression Using Context-Based Adaptive Arithmetic Coding", 2001 International Conference on Image Processing, Oct. 7, 2001, Thessaloniki, Greece, pp. 558-561.

Marusic et al., "A New Approach to Three-Dimensional Wavelet Based Video Coding", Electrotechnical Review, vol. 69, vol. 2, 2002, pp. 135-142. English Abstract.

Marisic et al., Adaptive Prediction for Lossless Image Compression, Signal Processing: Image Communication, vol. 17, 2002, pp. 363-372.

Son et al., "Scan interleaving based scalable binary shape coding", Signal Processing: Image Communication, vol. 15, 2000, pp. 619-629.

(56) References Cited

OTHER PUBLICATIONS

Vass et al., "Significance-Linked Connected Component Analysis for Very Low Bit-Rate Wavelet Video Coding", IEEE Transactions on Circuits and Systems for Video Technology, vol. 9, No. 4, Jun. 1999, pp. 630-647.
Yang et al., "An Embedded Image Coding Algorithm using Set Partitioning in Block Trees of Wavelet Coefficient", Visual Communications and Image Processing 2002, SPIE vol. 4671, 2002, pp. 1194-1204.
Zhao et al., "Low-Complexity and Low-Memory Entropy Coder for Image Compression", IEEE Transactions on Circuits and Systems for Video Technology, vol. 11, No. 10, Oct. 2001, pp. 1140-1145.
Gleich et al., "Context-based Image Coding Using Fuzzy Logic", Optical Engineering, vol. 41, No. 11, Nov. 2002, pp. 2814-2823.

* cited by examiner

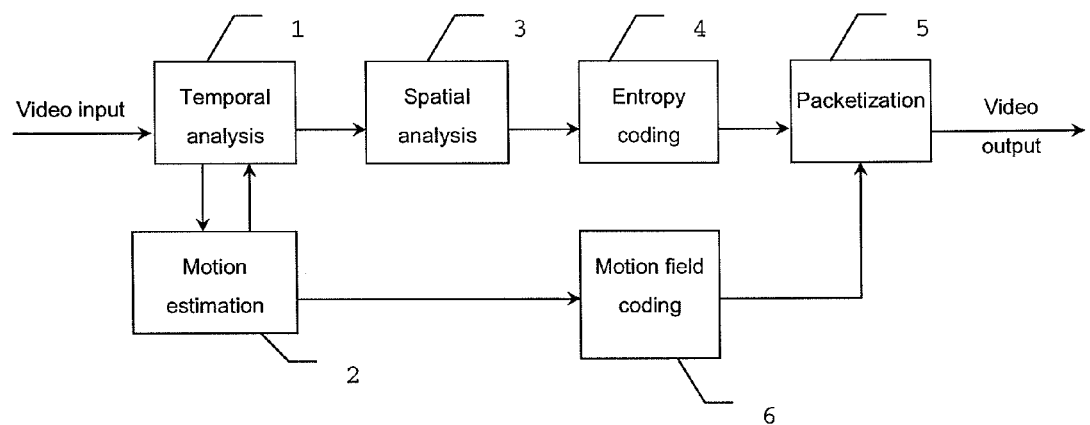
FIG.1 — PRIOR ART
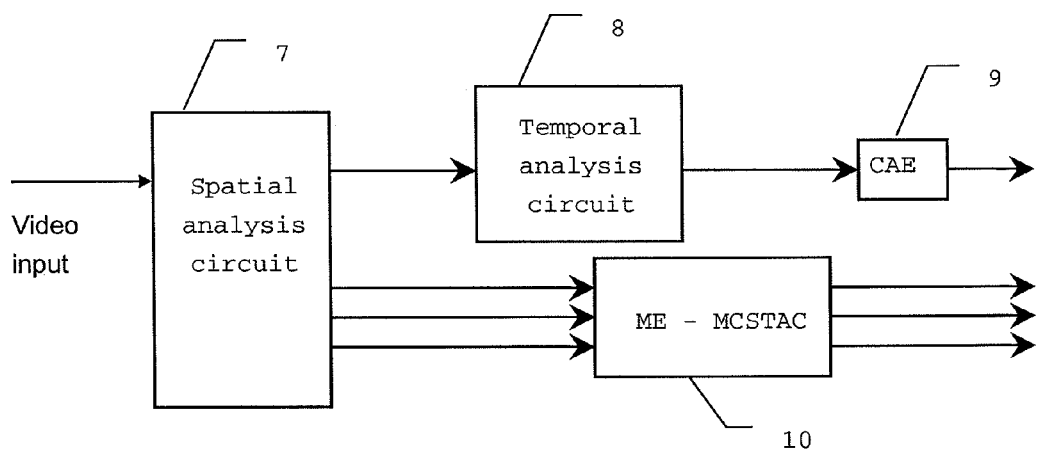
FIG.2

METHOD FOR CODING A VIDEO IMAGE TAKING INTO ACCOUNT THE PART RELATING TO A COMPONENT OF A MOVEMENT VECTOR

This application claims the benefit, under 35 U.S.C. §365 of International Application PCT/FR04/050084, filed Feb. 26, 2004, which was published in accordance with PCT Article 21(2) on Sep. 23, 2004 in French and which claims the benefit of French patent application No. 0302840, filed Mar. 6, 2003.

FIELD OF THE INVENTION

The invention relates to a method for encoding a video image within a sequence of images comprising a step for spatial analysis of the image and relying on the use of temporal prediction between images. More particularly, this is an entropy coding based on the temporal context of the image, the latter exploiting characteristics relating to the motion information.

BACKGROUND OF THE INVENTION

In coding standards known as hybrid standards, for example MPEG-1, MPEG-2, MPEG-4, h264, as in the majority of 2D+t sub-band coding schemes, for example MC-EZBC (Motion Compensated Embedded Zero Block Context), the first step in the coding sequence consists in taking advantage of the temporal redundancy between successive images, before exploiting the spatial redundancy within an image.

FIG. 1 shows a video coder scheme according to the prior art.

The video signal is transmitted to a temporal analysis circuit 1. A motion estimation circuit 2 is connected to this first circuit in order to estimate the movement between two images received by the coder. The motion information is transmitted to the circuit 1 and to a coding circuit 6, for example in the form of motion vector fields. The output of the circuit 1 is transmitted to a spatial analysis circuit 3 that extracts the image frequency coefficients from the texture. These coefficients are subsequently quantified then coded by an entropy coding, circuit 4. This coded information and the motion information are transmitted to a packet generation circuit or packetizer 5 that sends the video data in the form of video packets which form the video data stream.

The temporal analysis circuit 1 performs a motion compensated temporal prediction in the case of a hybrid scheme or MCTF (Motion Compensated Temporal Filtering) in the case of a sub-band coding scheme. The coding algorithms with temporal prediction consist in applying motion compensation in order to generate prediction images which later will be used in the coding process. These algorithms are based on the same principle. The images to be coded are predicted starting from one or more previously coded images, called reference images. This is the case in the video MPEG standards with Predicted (P) images and Bi-directional or Bi-predicted (B) images. The prediction consists in performing a motion compensation using these reference images and motion vectors associated with the current image. What is subsequently coded is the residue of the prediction, in other words the difference between the current image and the temporal prediction image. The motion is generally described in blocks of pixels and the motion compensation effected by block.

The spatial analysis circuit 3 performs, for example, a decomposition into wavelets or a discrete cosine transform. The entropy coding of the circuit 4 can be a coding of the VLC (Variable Length Coding) type or a coding of the arithmetic type.

The function of the packetization circuit is to divide up the texture and motion information coming respectively from the entropy coding circuit and from the coding circuit for the motion fields into coherent sub-assemblies according to their spatial and temporal frequency and their importance, for example, their weight in a bit-plane coding approach. Thus, the binary stream obtained is independently scalable in resolution, in frame frequency and in fidelity.

The estimated motion fields correspond to the resolution of the source. The motion compensation step of the coder, and also its inverse in the decoder, whether done by filtering or prediction, must therefore be executed on full resolution images in order to be coherent.

Spatial scalability—the possibility of transmitting and therefore of reconstructing images at various levels of resolution, for example images in SD (Standard Definition), CIF or QCIF format—is currently often exploited in video data transmission. The conventional coding schemes by spatio-temporal analysis, such as that previously described using wavelet decomposition or a discrete cosine transform, lend themselves to such scalability. It does not however allow the motion information to be adapted in an optimal manner to this scalability, in other words to the various resolutions of the image, and hence the data compression to be optimized. A video coder that follows the architecture described can be spatially scalable for the texture, but not for the motion. And, this motion information is not negligible. As an example, it represents around 30% of the whole of the binary stream when a low-rate 15 Hz CIF sequence is encoded. The usual architectures therefore suffer from an over-definition of the motion information which substantially affects the compression performance at low resolution.

Solutions exist for preserving the scalability of both the texture and the motion. The simplest means is to estimate the latter at the lowest spatial resolution allowed for decoding. Hence, the spatial decomposition is initially carried out. The temporal redundancy existing between the successive spatial high frequencies then remains to be exploited. For this purpose, several solutions have been proposed which re-introduce conventional temporal decorrelation tools: prediction or motion compensated filtering. Now, these conventional techniques are less efficient in the transform domain than in the pixel domain because of the phase problem generating the phenomenon known as 'shift-variance' of spatial transforms. Indeed, both the discrete wavelet transform (DWT) and the discrete cosine transform (DCT) are such that successive image coefficients, corresponding to the same pixel pattern, can be very different in sign and in absolute value, depending on the direction and amplitude of the movement, the direction and length of the spatial filter. The shift-variance intrinsic to spatial transforms requires a new approach for motion estimation, since it makes the temporal high frequencies unsuitable for coding by prediction or filtering.

SUMMARY OF THE INVENTION

The aim of the invention is to overcome the aforementioned drawbacks. One subject of the invention is a method for coding an image within a sequence of images, comprising a step for spatial analysis of a current image in order to deliver a signal of low spatial frequency and signals of high spatial frequency and performing an estimation of a movement between a current time corresponding to the current image and a reference time corresponding to a reference image in order to supply a motion vector, characterized in that it performs an entropy coding of at least one of the signals of high spatial frequency relating to the current image by taking a temporal context based on the estimation of a movement into account, one of the parameters exploited for the calculation of the temporal context being the parity relating to a component of the motion vector.

According to one particular embodiment, one of the parameters exploited for the calculation of the temporal context is the fractional part relating to a component of the motion vector.

According to one particular embodiment, for a signal of high spatial frequency, the component considered is that in the direction of the high-pass spatial filtering.

According to one particular embodiment, the entropy coding is an arithmetic bit-plane coding and the temporal context corresponds to the bit plane of the same level in the temporal reference image.

According to one particular embodiment, the arithmetic coding is an N-ary coding and the temporal context corresponds to N bit planes of the same level in the temporal reference image.

Another subject of the invention is a method for decoding an image, within a sequence of images, coded according to the coding method described herein above, characterized in that it performs an entropy decoding relating to at least one of the high spatial frequency signals by taking a temporal context based on the motion estimation into account, one of the parameters exploited for the calculation of the temporal context being the parity relating to a component of the motion vector.

According to one particular embodiment, the decoding method is characterized in that a parameter exploited for the calculation of the context is the fractional part relating to a component of the motion vector.

A further subject of the invention is a video coder implementing the preceding coding method, comprising a spatial analysis circuit receiving a video signal and delivering a signal of the lowest spatial frequency corresponding to the lowest resolution and signals of high spatial frequency for one or more higher resolutions, a motion estimation circuit for the calculation of motion vectors, characterized in that it comprises a circuit for entropy coding of at least one of the signals of high spatial frequency taking a temporal context based on the estimation of a movement into account, one of the parameters exploited for calculating the temporal context being the parity relating to a component of the motion vector.

Another subject of the invention is a video decoder for an image, within a sequence of images, coded according to the coding method described herein above, characterized in that it comprises an entropy decoding circuit implementing an algorithm for the calculation of a temporal context based on the motion estimation, one of the parameters exploited for the calculation of the temporal context being the parity relating to a component of the motion vector.

The method allows the temporal redundancy of the spatial transforms of the successive images, in particular of the high frequencies, to be better exploited, while at the same time keeping the spatial scalability of the motion and of the texture. Thanks to the multi-resolution description of the motion, the compression performance in terms of rate-quality, for each resolution of the spatial scalability, is improved.

The visual and objective quality of the decoded video is also improved thanks to the use of temporal redundancy without filtering or prediction, which are sources of artefact noise, for example the effects of blocks if the motion estimation is carried out in blocks.

BRIEF DESCRIPTION OF THE DRAWINGS

Other special features and advantages of the invention will become more apparent from the following description, presented by way of non-limiting example and with reference to the appended figures, which show:

FIG. 1, a coding scheme according to the prior art,

FIG. 2, a simplified block diagram of a coding circuit according to the invention, FIG. 3, a temporal neighbourhood for a pixel (x, y) of a current image, FIG. 4, a temporal and spatial neighbourhood for a pixel (x, y)

DETAILED DESCRIPTION OF PREFERRED EMBODIMENTS

Figure 3:
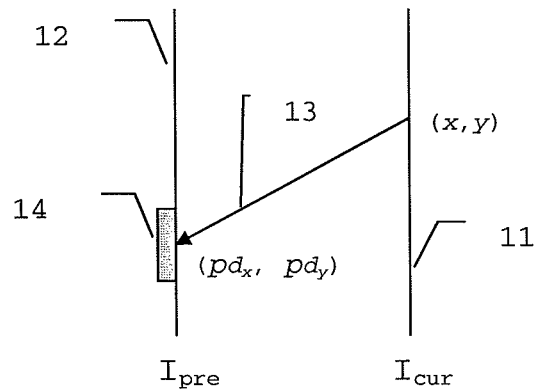

A coding circuit implementing the coding method according to the invention is shown in FIG. 2. The case, albeit non-limiting, of a decomposition into wavelets is chosen.

The video source is transmitted to a 2D spatial analysis circuit, referenced 7, which is therefore a circuit for decomposition of wavelets. It performs a spatial decomposition in order to supply sub-band coefficients of various spatial resolutions. A first output delivering the lowest resolution coefficients is connected to a temporal analysis circuit 8. The other outputs corresponding to the sub-band coefficients of higher resolution are connected to the inputs of an arithmetic coding circuit exploiting the motion compensated spatio-temporal context or MC-STAC (Motion Compensated Spatio-Temporal Arithmetic Coding) circuit. The temporal analysis circuit 8 is connected to a context-based arithmetic encoding or CAE circuit 9. The outputs of the MC-STAC circuit correspond to the various resolutions.

Starting from a video image, the 2D spatial wavelet decomposition circuit generates wavelet coefficient images or sub-images, each corresponding to a given spatial frequency band, until the lowest resolution accepted by the decoding is reached. The image is decomposed into base band or low band (LL) and into high bands (LH, HL, HH), within the spatial domain.

Only the images corresponding to the base band are processed by the temporal analysis circuit 8. The lowest spatial resolution signal (LL), coming from the spatial analysis circuit 7, is therefore transmitted to the temporal analysis circuit 8. This circuit performs a motion estimation then a motion compensated temporal filtering, also called MCTF. The temporal analysis consists in the generation of intermediate images from the received images at the input frequency in order to obtain a temporal scalability. Such an analyser circuit is for example of the MC-lift type, explained below. The temporal filtering consists, for example, in the subtraction of the current image from an image predicted from a motion compensated preceding image.

The images other than those corresponding to the base band are processed by the motion compensated spatiotemporal context arithmetic coding or MCSTAC circuit 10. Indeed, these sub-bands, required for the reconstruction of the successive resolutions up to the original resolution, are not suitable for a conventional filtering or temporal prediction technique and are therefore immediately arithmetically coded. In order to make use of the residual temporal redundancy, that links the successive spatial high frequencies, this adaptive contextual arithmetic coding step involves the use of motion information as is explained hereinafter.

The distribution of the wavelet coefficients of a spatial high frequency is as follows: large connected areas of zeros, or of low-amplitude coefficients, which correspond to the uniform regions of the image, are separated by the contours, which are conventionally continuous curves, along which the amplitude of the coefficients varies rapidly, as does their sign.

Accordingly, the spatial context data, that is widespread in the existing schemes, allows the amplitude and the sign of the coefficients to be coded to be rendered more probable, hence the entropy of the sub-band to be decreased and the compression ratio to be increased. An operational algorithm for contextual arithmetic coding based on the spatial context is, for example, described in the article by G. Langdon and J. Rissanen entitled "Compression of black-white images with arithmetic coding", IEEE Transactions on Communications, vol. 29, no. 6, pp 858-867, June 1981. This arithmetic coding is contextual because the estimation and the use of probability tables, instead of being global for the whole of the signal, depend on the context, in other words locally adapted according to a classification of the possible configurations of the neighbourhood. This kind of coding is well suited to coding high frequency coefficients of a spatial DCT or DWT, since it takes advantage of the residual local spatial correlation. The various contexts are usually determined by a combination of the possible values of the immediate neighbours. The arithmetic coding is adaptive because the estimation of the statistics is carried out by a learning process, during the coding process, starting from an initialization value.

The implementation of the temporal dimension of the context, according to the known methods, is not a very efficient process. In spite of the higher abundance of information than for a strictly spatial context, the data of the coefficients directed by the motion vector can be misleading for the statistics learning phase owing to the phenomenon of shift-variance that has been evoked herein above. Depending on the dynamics of the spatial variation, the displacement and the length of the spatial filter, the wavelet or DCT coefficients of a pixel pattern and of its transform will, in principle, have different amplitudes and a different sign. If the displacement is by an even number of whole pixels, the transforms will be 'in phase'; if the displacement is by an odd number of whole pixels, the transforms will be 'in phase opposition', etc. This reasoning can be followed whatever the sub-pixel precision of the estimated motion. It is this discriminating information that it is proposed to attach, in an innovative way, to the spatio-temporal context, in order to allow the evaluation of the statistics of the succession of high frequencies to best converge towards its conditional distribution.

The approach proposed consists in using a contextual entropy coding, where the context includes a temporal context.

The entropy coding and the arithmetic coding allow a mean length of code below one bit to be used for highly probable values. An essential point of entropy coding is the determination of probability tables characterizing the statistics of the signal to be coded.

First of all, the composition of an adaptive probability table, taking into account, for example, the spatial context, will briefly be recalled. The case of a bit-plane coding will be considered. In this case, the values taken into account in the coding and the context are binary values: 0 or 1.

The values of the pixels surrounding the current pixel and that have just been processed, for example the three closest neighbours, are considered. Hence, a list of $2^3=8$ different contexts is available. With each context is associated a table of probabilities. These probability tables are adaptive, in other words updated in the course of the coding process, according to the values of the processed coefficients. The coding algorithm operates by running through the coefficients of the image in a predefined order. At each stage of the process, a context is characterized by its number of occurrences up to the moment in question, together with the number of times, among these occurrences, where the value 1 (or 0) was encountered. Accordingly, during the coding of a current bit relating to a bit plane of a given element, if the context of this element is Cj, the number of occurrences relating to Cj is incremented and the number of times where the value 1 is encountered is incremented if the value of the bit is 1. The probability of obtaining a 'zero' or a 'one' in the context Cj is calculated in the following manner: The probability of obtaining a zero ($p_0$) is equal to the number of zeros encountered for the given context divided by the total number of occurrences of this context. Thus, the current bit x in the context Cj is coded knowing the probability $P_x$ of this bit in the context Cj.

Here, it is proposed to operate an entropy coding by using various statistics of the signal and the probability tables as a function of the spatio-temporal context.

The preceding image is denoted $I_{prec}$ and the current image to be coded is denoted $I_{cur}$. These images are not necessarily luminance images; they may be wavelet coefficient images, motion field images, etc.

These images are respectively referenced 12 and 11 in FIG. 3, which represents a temporal neighbourhood of a pixel (x, y) of a current image. At every pixel (x, y) of this current image, the data value to be processed will be coded as a function of its temporal neighbourhood. This temporal neighbourhood corresponds to the data values from the preceding image, localized in the neighbourhood of the displaced pixel ($pd_x$, $pd_y$) referenced 14, in other words directed by the motion vector of the pixel (x, y) referenced 13 in this FIG. 3.

The temporal context, denoted $C(pd_x, pd_y)$, is a function of the data of the temporal neighbourhood. In order to lighten the notations, $C(pd_x, pd_y)$ will be denoted C in the following description. According to the number k of coefficients considered in the temporal context, a list of $2^k$ contexts will be available. For each context, a table of probabilities is defined in an adaptive manner, in the same way as was described in the case of a temporal context.

It is of course possible to use different motion fields for different bit planes, by exploiting for example a rough description of the motion for the first bit plane, a more refined version for the second bit plane, and so on.

The use of a temporal context may be combined with the use of a spatial context. If the number of coefficients forming the spatial context is denoted j, and k the number of coefficients forming the temporal context, a list of $2^{j+k}$ contexts is then available.

Figure 4:
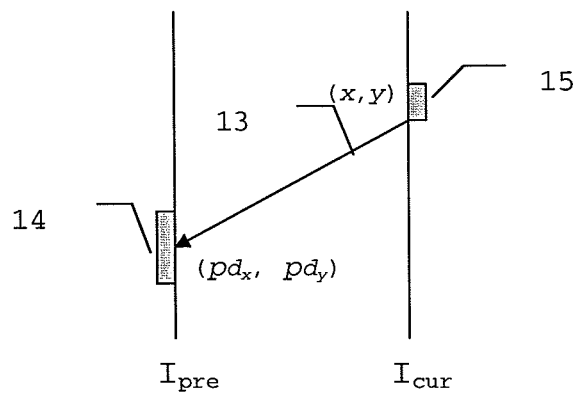

FIG. 4 illustrates a temporal neighbourhood 14 defined using a motion vector 13 associated with the pixel (x, y) of co-ordinates (x, y) and combined with a spatial neighbourhood 15 around this pixel (x, y).

Figure 5:
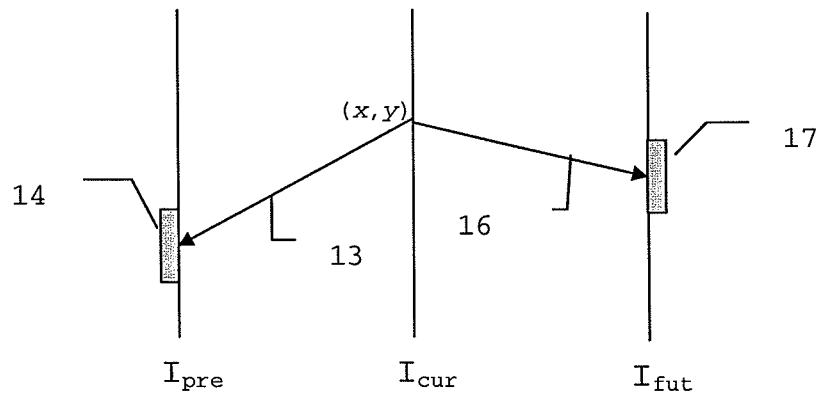
FIG. 5, two temporal neighbourhoods for a pixel (x,y)

According to the same principle, the use of more than one temporal context may be envisaged, in a similar manner to the prediction using several reference images, such as is used in the MPEG standards with the Bi-directional images. FIG. 5 shows a preceding image and a following image around the current image. The forward motion vector (as in the MPEG standard) 13 allows the temporal neighbourhood 14 relating to the preceding image $I_{prec}$ to be defined and the backward motion vector 16 allows the temporal neighbourhood 17 relating to the following image $I_{future}$ to be defined.

One of the most important aspects of the invention relates to the type of parameters exploited in order to define the spatio-temporal context. The phenomenon of 'shift-variance', described herein above, tends to 'disorientate' a contextual arithmetic codec. In order that the adaptation of the probability tables does not suffer from this phenomenon, parameters that are determinant of the 'shift-variance' are incorporated into the context data value.

The parameters considered are therefore all or a part of the following parameters:
  a spatial neighbourhood of a given number of coefficients,
  a motion compensated temporal neighbourhood of coefficients of another, already coded, temporal sample of the spatial sub-band being considered,
  the parity of at least one of the components of the displacement in the high-pass filtering direction of the spatial sub-band being considered,
  the fractional part of at least one of the components of the displacement in the direction of the high-pass filtering of the spatial sub-band being considered.

The parity of the integer part of the displacement allows the case where temporal and spatial neighbourhoods are in phase and in phase opposition to be distinguished, the fractional part of the displacement allows this information on 'phase-shift' induced by the displacement to be directed. Lastly, for these parameters, it is advantageous that only the component in the direction of the high-pass filtering be considered, since this is the discriminating component. This will be the vertical component for the sub-band of horizontal details (LH) and the horizontal component for the sub-band of vertical details (HL). The sub-band of diagonal details (HH) is a special case in that it possesses two filtering directions, respectively oriented at +45° and −45°. For this band, the two components can be considered simultaneously, which increases the number of contexts, or alternatively, in order to limit this number, functions of the parameters of both components may be used. Thus, the amplitude of the displacement may for example be considered, or more simply, the sum of the two components or, alternatively, only that with the highest amplitude be retained. For the displacement amplitude, the parity relates to the diagonal distance between two neighbouring pixels.

Figure 6:
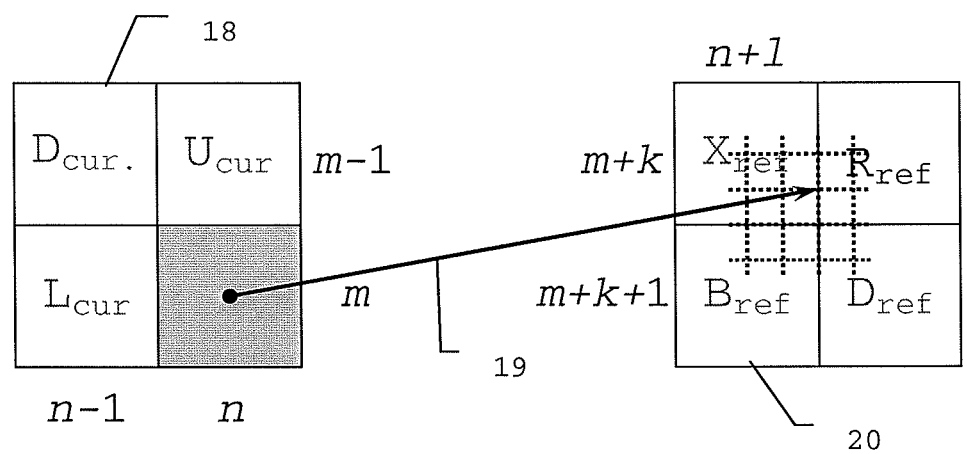
FIG. 6, the spatial and temporal neighbourhood of a pixel (m, n)

FIG. 6 shows an example of spatio-temporal neighbourhood in the case of a restricted number of neighbouring coefficients for each context and of a reasonable motion precision of a quarter of a pixel. The spatial neighbourhood 18 of a current coefficient (m, n) situated on the row m and the column n of the current image, shown in grey, corresponds to three previously processed neighbouring coefficients $L_{cur}$, $U_{cur}$ and $D_{cur}$. The temporal neighbourhood 20 corresponds to the four coefficients $X_{ref}$, $B_{ref}$, $R_{ref}$ and $D_{ref}$ designated by the motion vector 19 pointing into the reference image. The coefficient $X_{ref}$ is situated on the row m+k and the column n+l.

Figure 7:
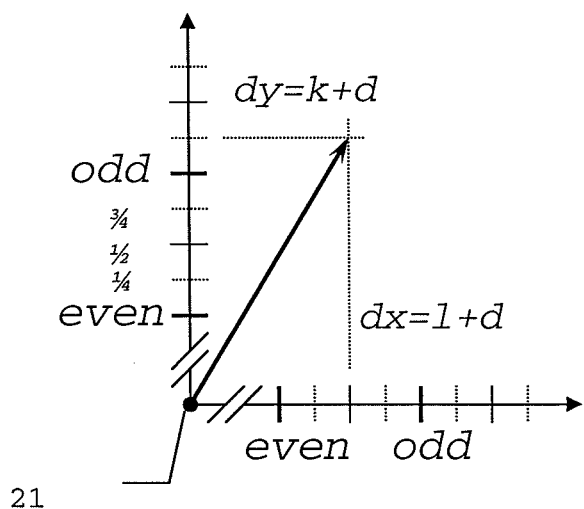
FIG. 7, the parity and the fractional part of the components of the motion vector, FIG. 8 a block diagram of a coding circuit according to the invention.

FIG. 7 shows the parameters relating to the components of the displacement vector. The graduation of the axes, on the orthonormal co-ordinate system 21, corresponds to a quarter of the distance between two pixels. The parity relates to the components of the motion vector. The over-sampling grid around the end of the motion vector allows the determination of the corresponding fractional parts, $Fract_{dx}=dl$ and $Fract_{dy}=dk$, a fraction of 2 quarters in the horizontal direction and of one quarter in the vertical direction in the example in FIG. 6.

dx=l+dl is the horizontal component of the vector, dy=k+dk is the vertical component of the vector.

The parities of the horizontal and vertical components are $Par_x$=l mod2 and $Par_y$=k mod2, respectively. The coefficients are in phase or in phase opposition according to whether there is parity or non-parity.

The wavelet coefficients are encoded in bit planes. For each bit plane, the significance of the coefficients L, U and D, together with that of the coefficients X, B, R and D is determined. This is achieved by measuring whether the value of a coefficient is greater than the value corresponding to the weight of the bit relating to the plane being processed. The fractionation and parity information is also recorded. The contexts can therefore be indexed generically with the following binary data stream:

| $L_{cur}$ | $U_{cur}$ | $D_{cur}$ | $Frac_{dX}$ | $Frac_{dy}$ | $Par_x$ | $Par_y$ | $X_{ref}$ | $B_{ref}$ | $R_{ref}$ | $D_{ref}$ |
|---|---|---|---|---|---|---|---|---|---|---|

The fractional parts are each coded over 2 bits (0 to 3 quarters of a pixel), the other parameters over 1 bit.

The parity and fractionation parameters of several vectors may of course be taken into account, in the case where more than one motion vector is associated with a coefficient or a pixel, for example when several reference images are exploited.

The motion estimation of the temporal analysis circuit 8 is performed in a conventional manner over the low-frequency bands transmitted to the input of this circuit.

The motion estimation method (ME) implemented by the ME-MCSTAC circuit 10 can be carried out according to various approaches, for example:
  motion estimation over successive low-frequency bands,
  motion estimation directly over the high-frequency bands.

The first case is the simplest to implement. At each step in the spatial decomposition, a motion field is estimated over the low frequency, before the latter is again sliced into four sub-bands. As the source can then be related to the pixel domain, this estimation can be carried out in a conventional manner by minimization of the prediction error.

The motion is then coherent in resolution because it has the dimensions of the three high-frequency bands to be coded with MC-STAC, and indeed contains the displacement information at the desired resolution.

Thus, the motion estimated on the e.g. CIF resolution is used to code the three bands of horizontal, vertical and diagonal details with MC-STAC which are used to go from the CIF to SD resolution. In a similar manner, the motion estimated on the QCIF resolution, in addition to serving as a support for the conventional MCTF for the sequence at the QCIF resolution, allows the three bands of horizontal, vertical and diagonal details, which are used to go from the QCIF to CIF resolution, to be coded with MC-STAC. As will be seen below, FIG. 9 describes a coder exploiting this solution.

It may also be desirable to have a motion field more dedicated to the MC-STAC application. The motion on each high-frequency band to be coded then needs to be estimated; this is the second case. As the high frequencies contain less information than the low frequencies, it is reasonable to think that the fields estimated over the high frequencies are less costly than that estimated over the low frequency. Nevertheless, because of the shift-variance phenomenon described herein above, the criteria used for the estimation can no longer consist of a simple DFD minimization. The criterion chosen is the minimization of the conditional entropy implicitly associated with MCSTAC. Such a criterion corresponds to a retrospective choice of vector, and can be very costly in terms of resources and complexity. However, this is of course the optimal criterion. Another criterion is the minimization of the difference in the absolute values. This is a very simple criterion that allows a first obstacle of the shift-variance to be overcome.

These motion estimations can also be effected in bit planes.

The temporal analysis circuit 8 relies, in one example, on a known technique called Motion Compensated Lifting or MC-Lift, in order to obtain images with the desired temporal resolutions. MC-Lift consists in constructing, for one group of images, various levels of temporal resolution. For each temporal resolution, except for the first, the images are constructed by temporal prediction starting from the images of the lower temporal resolution.

Figure 8:
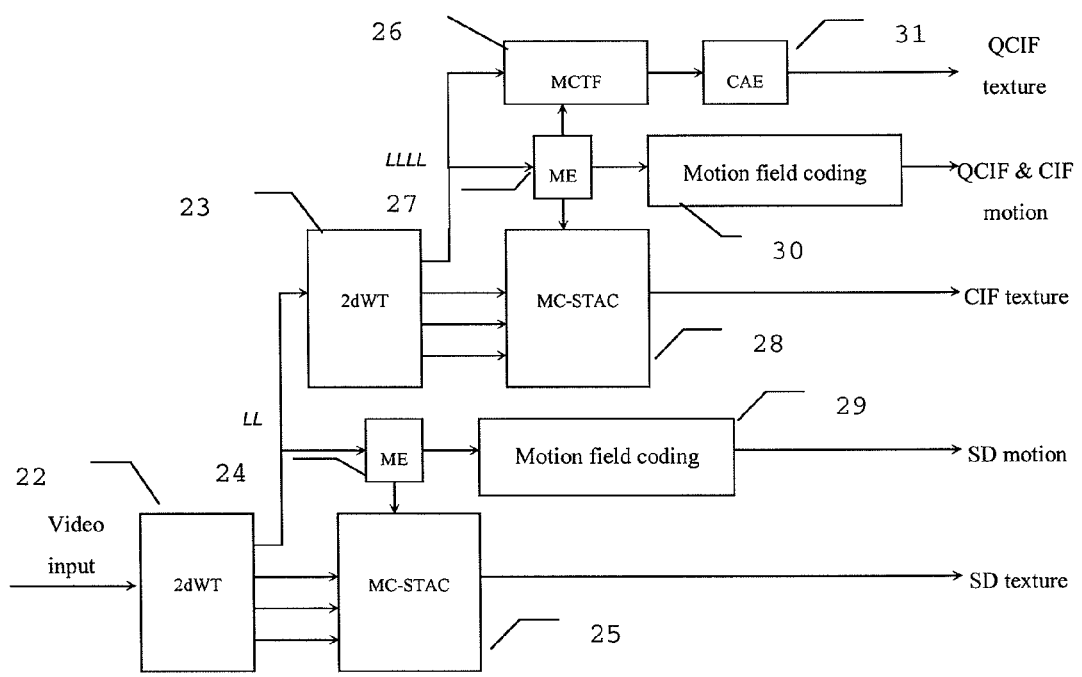

FIG. 8 describes, in a more detailed manner, a device implementing the method according to the invention.

The video input of the coder is connected to a 2D wavelet transform (2dWT) circuit 22 that delivers the low band LL and the high bands LH, HL and HH at its output. The low band LL is connected to a second 2D wavelet transform circuit 23 and to a motion estimation ME circuit 24. The high bands LH, HL and HH are connected to an MC-STAC circuit 25. The second 2D wavelet transform circuit 23 delivers the low band LLLL at one output and the high bands LLLH, LLHL and LLHH at the other outputs. The low band LLLL is connected to an MCTF circuit 26 and a motion estimation ME circuit 27. The high bands are connected to a second MC-STAC circuit 28.

The motion information from the ME circuit 24 is transmitted to the MC-STAC circuit 25 and the motion information from the ME circuit 27 is transmitted to the MCTF circuit 26 and to the MC-STAC circuit 28.

The outputs of the MC-STAC circuits 25 and 28 deliver the textures at the SD and CIF resolutions. The outputs of the ME circuits 24 and 27 are respectively connected to circuits for coding the motion field 29 and 30 which deliver the SD motion information for the circuit 29, QCIF and CIF motion information for the circuit 30. The output of the MCTF circuit 26 is connected to a context-based arithmetic encoding CAE circuit 31 that performs an entropy coding so as to deliver the coded texture of QCIF resolution at its output.

Accordingly, the video input signal undergoes a pyramidal wavelet decomposition by the circuit 22 then the circuit 23. The motion estimations, as indicated above, are performed over the low bands. The motion estimation calculated over a low band of given spatial resolution is exploited by the motion compensated spatio-temporal context arithmetic coding MC-STAC circuits coding the high bands of resolution corresponding to this low band.

The base band LLLL is processed in a conventional manner by the MCTF circuit 26 that performs a motion compensated temporal filtering.

The decoding methods and circuits implementing the invention correspond to the coding methods and circuits previously described.

Thus, the decoding method calculates a context by relying on the information on the stream of data coded according to the coding method described. This information, already decoded during the processing of the current coefficient, allows the lists of contexts to be calculated and to be continuously updated, for the various parameters chosen in the coding, for the calculation of this coefficient.

The entropy decoding circuit implements an algorithm for calculating the probability tables and the context according to the previous method.

The coding described is a bit-plane, therefore binary, coding. Exploiting an N-ary coding, in other words performing the simultaneous coding of N bit planes, may also be envisaged. Therefore, rather than a binary value, that of the bit plane, the contexts exploited take into account the N-ary value comprising N bits. The list of the different contexts that result from this is longer, increasing the number of calculations, but the coding efficiency is improved.

The description relates to a 'fully scalable' scheme, in other words a scheme that, at the same time, is scalable spatially, temporally and in fidelity, allowing any decoder to exploit the coding stream. Another kind of scheme, for example that has no temporal scalability, would still come within the field of the invention.

Entropy coding using the temporal context is described only over the spatial high frequencies, since the spatial low frequencies lend themselves to a temporal filtering starting from a predicted image. The application of such an entropy coding over all the spatial frequencies of the signal may of course be envisaged, without straying from the field of the invention.

Similarly, the motion estimation can be carried out over the base band or on the source image.

The parity is calculated on the integer part of the component. It could also be calculated on the closest integer value.

The entropy coding described is an arithmetic coding. The method according to the invention may also be applied to other types of entropy coding exploiting the statistical properties of the signal, for example a coding of the VLC type.

The applications of the invention relate to video compression with temporal prediction.

What is claimed is:

1. A method for coding an image within a sequence of images, comprising
spatial analysis of a current image in order to deliver a signal of low spatial frequency and signals of high spatial frequency and performing an estimation of a movement between a current time corresponding to the current image and a reference time corresponding to a reference image in order to supply a motion vector, and
contextual entropy coding of at least one of the signals of high spatial frequency relating to the current image using table of probabilities defined by a temporal context based on the estimation of a movement, one parameter exploited for a calculation of the temporal context being a parity relating to a component of the motion vector.

2. The method according to claim 1, wherein one parameter exploited for the calculation of the temporal context is a fractional part relating to a component of the motion vector.

3. The method according to claim 1, wherein, for a signal of high spatial frequency, the component considered is that in a direction of high-pass spatial filtering.

4. The method according to claim 1, wherein the temporal context is combined with a spatial context.

5. The method according to claim 1, wherein the temporal context is based on more than one motion estimation using more than one reference image.

6. The method according to claim 1, wherein the contextual entropy coding is an arithmetic coding.

7. The method according to claim 6, wherein the arithmetic coding is a coding by bit plane and the temporal context corresponds to the bit plane of the same level in the reference image.

8. The method according to claim 6, wherein the arithmetic coding is an N-ary coding and the temporal context corresponds to N bit planes of the same level in the temporal reference image.

9. The method according to claim 1, wherein the motion estimation is carried out using one of the signals delivered by a spectral analysis.

10. The method according to claim 6, wherein the motion estimation is performed by bit plane and the temporal context, for one bit plane, is based on the motion estimation over the said bit plane.

11. The method according to claim 1, wherein the spatial analysis is a wavelet transformation.

12. A method for decoding an image within a sequence of images comprising contextual entropy decoding relating to at least one of the high spatial frequency signals using probability tables defined by a temporal context based on the motion estimation, one parameter exploited for a calculation of the temporal context being a parity relating to a component of a motion vector.

13. The decoding method according to claim 12, wherein one parameter exploited for the calculation of the temporal context is a fractional part relating to a component of the motion vector.

14. A video coder comprising:
a spatial analysis circuit receiving a video signal and delivering a signal of low spatial frequency corresponding to a lowest resolution and signals of high spatial frequency for one or more higher resolutions,
a motion estimation circuit for a calculation of motion vectors, and
a circuit for contextual entropy coding of at least one of the signals of high spatial frequency using probability tables defined by a temporal context based on an estimation of a movement, one parameter exploited for calculating the temporal context being a parity relating to a component of the motion vector.

15. A video decoder for an image, within a sequence of images comprising a contextual entropy decoding circuit implementing a method for calculating probability tables defined by a temporal context based on motion estimation, one parameter exploited for a calculation of the temporal context being a parity relating to a component of the motion vector.

16. The video coder according to claim 14, wherein one parameter exploited for the calculation of the temporal context is a fractional part relating to a component of the motion vector.

17. The video coder according to claim 14, wherein, for a signal of high spatial frequency, the component considered is that in a direction of high-pass spatial filtering.

18. The video coder according to claim 14, wherein the temporal context is combined with a spatial context.

19. The video coder according to claim 14, wherein the temporal context is based on more than one motion estimation using more than one reference image.

20. The video coder according to claim 14, wherein the contextual entropy coding is an arithmetic coding.

21. The video coder according to claim 20, wherein the arithmetic coding is a coding by bit plane and the temporal context corresponds to the bit plane of the same level in the reference image.

22. The video coder according to claim 20, wherein the arithmetic coding is an N-ary coding and the temporal context corresponds to N bit planes of the same level in the temporal reference image.

23. The video coder according to claim 14, wherein the the calculation of motion vectors by the motion estimation circuit is carried out using one of the signals delivered by a spectral analysis.

24. The video coder according to claim 20, wherein the calculation of motion vectors by the motion estimation circuit is performed by bit plane and the temporal context, for one bit plane, is based on the motion estimation over the said bit plane.

25. The video coder according to claim 14, wherein the spatial analysis is a wavelet transformation.

26. The video decoder according to claim 15, wherein on parameter exploited for the calculation of the temporal context is a fractional part relating to a component of the motion vector.

* * * * *